United States Patent [19]

Li Bassi et al.

[11] Patent Number: 4,672,079
[45] Date of Patent: Jun. 9, 1987

[54] POLYMERIC OR POLYMERIZABLE AROMATIC-ALIPHATIC KETONES SUITABLE FOR USE AS POLYMERIZATION PHOTOINITIATORS

[75] Inventors: Giuseppe Li Bassi, Gavirate; Luciano Cadoná; Carlo Nicora, both of Varese; Carlo Carlini, Pisa, all of Italy

[73] Assignees: Fratelli Lamberti S.p.A., Albizzate; Consiglio Nazionale Delle Ricerche, Rome, both of Italy

[21] Appl. No.: 720,344

[22] Filed: Apr. 5, 1985

[30] Foreign Application Priority Data

Apr. 12, 1984 [IT] Italy .................. 20498 A/84

[51] Int. Cl.$^4$ .................. C08F 2/50; C08F 4/32; C08F 20/20; C08G 63/10
[52] U.S. Cl. .................. 522/35; 522/34; 522/36; 522/39; 522/44; 522/102; 522/103; 522/182; 522/904; 525/300
[58] Field of Search .................. 526/316; 522/35, 34, 522/904, 905

[56] References Cited

U.S. PATENT DOCUMENTS

| | | | |
|---|---|---|---|
| 2,706,725 | 4/1955 | Unruh | 526/316 |
| 2,708,665 | 5/1955 | Unruh | 526/316 |
| 2,713,570 | 7/1955 | Kenyon | 526/316 |
| 3,214,492 | 10/1965 | Tocker | 526/316 |
| 3,265,772 | 8/1966 | Tocker | 526/316 |
| 3,315,013 | 4/1967 | Tocker | 526/316 |
| 3,565,779 | 2/1971 | Luders | 526/316 |
| 3,591,661 | 7/1971 | Rogers | 526/316 |
| 3,594,348 | 7/1971 | Maar | 526/316 |
| 4,318,791 | 3/1982 | Felder | 204/159.23 |
| 4,321,118 | 3/1982 | Felder | 204/159.24 |
| 4,347,111 | 8/1982 | Gehlhaus | 204/159.23 |
| 4,498,964 | 2/1985 | Husler | 204/159.24 |

*Primary Examiner*—John C. Bleutge
*Assistant Examiner*—Arthur H. Koeckert
*Attorney, Agent, or Firm*—Stevens, Davis, Miller & Mosher

[57] ABSTRACT

A new class of polymeric or polymerizable aromatic-aliphatic ketones, the preferred of which are: 2-hydroxy-2-methyl(4-vinylpropiophenone), 2-hydroxy-2-methyl-p(1-methylvinyl)propiophenone, p-vinylbenzoylcyclohexanol, p-(1-methylvinyl)benzoyl-cyclohexanol and their oligomerization and polymerization products, they being suitable for use as photoinitiators for the photopolymerization of ethylenically unsaturated monomers and prepolymers.

Said ketones are produced by subjecting an aromatic substrate, preferably a monomer or oligomer of styrene type, to the following reaction cycle: polymerization - acylation - alphachlorination - nucleophilic substitution with the formation of epoxyether - hydrolysis of the epoxyether; or to other reactions as modifications or alternatives to this cycle.

The ketones according to the present invention have high efficiency as photoinitiators both with regard to the useful concentration to be used and with regard to the polymerization rate.

3 Claims, No Drawings

POLYMERIC OR POLYMERIZABLE AROMATIC-ALIPHATIC KETONES SUITABLE FOR USE AS POLYMERIZATION PHOTOINITIATORS

This invention relates to a new class of aromatic-aliphatic ketones suitable for use as photoinitiators for the photopolymerisation of ethylenically unsaturated monomers and prepolymers.

More precisely, the invention relates to a new class of polymeric or polymerisable aromatic-aliphatic ketones, their production process, and their use in photopolymerisable mixtures.

The photochemical polymerisation of unsaturated monomers and prepolymers is a currently well known process which has wide industrial application.

This type of reaction takes place by the interaction between light energy, in a well defined portion of the electromagnetic spectrum, and a suitable substrate able to absorb the light and to undergo polymerisation. By various mechanisms which depend on the nature of the substances present, the irradiation results in the generation of radical species which, in a very short time, give rise to polymerisation of the molecules containing ethylenic double bonds. Special photosensitisers and photoinitiators are generally used for facilitating light absorption and for generating the radical species.

The photosensitisers serve for absorbing and transferring the light energy if the photoinitiator does not absorb within the spectral regions useful to the photochemical reaction, whereas the photoinitiators serve for generating the polymerisation-promoting radicals.

The efficiency of these products has been gradually improved with the promulgation of technologies which use photopolymerisation processes, as in the case of paints and lacquers, printing inks, the manufacture of printing plates and electronic circuits etc.

The term "efficiency" applied to these products means in particular the reactivity, both in terms of the quantitative yield (quantity of monomer converted for each quantum of light absorbed) and in terms of polymerisation rate (time for the substrate to attain determined chemical-physical characteristics), and also the darkness stability of the mixtures containing the photoinitiator.

Many practical problems have been solved by using benzoin alkylethers as photoinitiators, such as those described in U.S. Pat. No. 2,448,828, dialkoxyacetophenones and benzilmonoketals as described in U.S. Pat. No. 3,715,293, and benzophenone in combination with hydrogen donors of tertiary amine type.

More recently, certain products pertaining to the substituted acetophenone class have been introduced, such as those proposed in U.S. Pat. Nos. 4,318,791 and 4,347,111.

In particular, for acrylic systems the 2,2-dialkyl-2-hydroxyacetophenones have resulted in the solving of problems connected with the yellowing of the photochemically crosslinked product (deriving either from the U.V. light of the crosslinking lamp or from subsequent ageing by exposure to natural light) without this leading to a reduction in efficiency.

We have now discovered a new class of compounds suitable for use as photoinitiators, said class of compounds constituting the subject matter of the present invention.

The present invention relates to the products represented by general formula (I), their production process and their use in photopolymerisable mixtures:

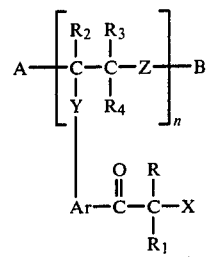

where:

Z signifies a direct bond coinciding with A and B in a pi bond for $n=1$, or is an O atom or an S atom;

Y signifies a direct bond or S, O, —OCO—, —COO—, linear or branched alkylene or alkylidene or 1 to 10 carbon atoms, carboxyalkyleneoxy, carboxypolyalkyleneoxy or phenylene;

n is 1 when A and B together represent an electronic covalent bond whereas it varies from 2 to $10^6$ in other cases;

Ar represents an aromatic nucleus of phenylene type which is either unsubstituted or carries one or more groups of the Cl, Br, O-alkyl, aryl, aralkyl, O-aryl, S-alkyl, alkyl, cycloalkyl, alkenyl, $CH_2$—O—alkyl, —$CCl_3$, $CF_3$, N(alkyl)$_2$, —CO—O—alkyl or furyl, pyridyl or thienyl type;

X represents OH, O-alkyl, O-cycloalkyl, O—$NR_5R_6$, $OSi(CH_3)_3$ or together with R, $R_1$ represents O-alkylene, or a $NR_5R_6$ group in which $R_5$ can be H, alkyl, OH, O-alkyl, $NH_2$ or NH-alkyl, and $R_6$ can be H, or alkyl, or X represents SH, S-alkyl, Cl, Br, F, SCN or $N_3$;

R, $R_1$, which can be equal or different, each independently represent alkyls of 1 to 18 carbon atoms, alkoxyalkyl, dialkylaminoalkyls, alkenyls of 2 to 6 carbon atoms, cycloalkyls of 3 to 6 carbon atoms, or R, $R_1$ together represent an alkylene of 2 to 7 carbon atoms possibly substituted by alkyl, alkoxy, carboxy or carboxylakyl groups or containing unsaturated bonds;

$R_2$, $R_3$, $R_4$, which can be equal or different, each independently represent hydrogen, linear or branched alkyl of 1 to 10 carbon atoms possibly substituted by —Y—Ar—CO—C($RR_1$)X, phenyl possibly substituted by —CO—C($RR_1$)X, or carboxyalkyl;

A and B each independently represent equal or different radicals of the hydrogen, alkyl, alkoxy, acyl, aroyl, aroyloxy, aryl (possibly substituted by OH, or O-alkyl), aralkyl, 2-isobutyrylnitrile, chlorine, bromine or $CCl_3$ type, or A and B together represent a covalent bond.

These products, unknown previously, are aromatic-aliphatic ketones which possess excellent photoinitiating properties, and in particular result in a higher photopolymerisation rate than conventional non-polymeric or non-polymerisable photoinitiators. They produce manufactured products or coatings which do not become yellow under the action of ultraviolet light or under the normal ageing conditions in the presence of sunlight.

The by-products of the photochemical reaction give little odour and are also compatible with the polymerised system. The stability of the photopolymerisable mixtures containing the products according to the present invention in darkness is excellent.

The preferred compounds are those of formula (I) in which:

Y is a direct bond;

Z is a direct bond coinciding with A and B in a pi bond for n=1;

n is 1 when A and B together represent a covalent bond, or varies from 2 to 100 in all other cases;

Ar represents a phenylenic aromatic nucleus which is unsubstituted or substituted with alkyls or alkoxyalkyls;

X represents OH, OCH$_3$, OSi(CH$_3$)$_3$ or Cl; R, R$_1$, which can be equal or different, each independently represent an alkyl of 1 to 8 carbon atoms, or an alkylene of 2 to 3 carbon atoms, or together represent an alkylene of 2 to 5 carbon atoms possibly substituted by carboxyalkyl groups or unsaturated bonds;

R$_2$, R$_3$, R$_4$ each independently represent H or linear or branched alkyls of 1 to 10 carbon atoms possibly substituted by —C$_6$H$_4$—CO—C(RR$_1$)X;

A and B have the already stated meanings.

Of these compounds, those which are particularly preferred are those of general formula (II):

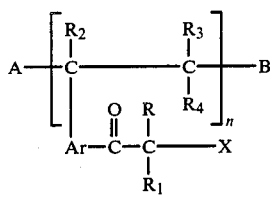

(II)

in which:

n is 1 when A and B together represent a covalent bond, or varies from 2 to 50 in all other cases;

Ar represents an aromatic nucleus of phenylene type which is not further substituted;

X represents OH, O(SiCH$_3$)$_3$ or OCH$_3$;

R, R$_1$, which can be equal or different, each independently represent an alkyl of 1 to 4 carbon atoms, or together represent an alkylene of 2 to 5 carbon atoms;

R$_2$, R$_3$, R$_4$ each independently represent hydrogen or a linear or branched alkyl of 1 to 4 carbon atoms possibly substituted by —C$_6$H$_4$—CO—C(RR$_1$)X;

A, B each independently represent H, alkyl, alkoxy, aralkyl, acyl, aroyl, aroyloxy or 2-isobutyrylnitrile, or together represent a covalent bond.

Examples of polymerisable and polymeric products included within the structures of formulas (I) and (II) are as follows: 2-hydroxy-2-methyl)p-vinylpropiophenone), 2-hydroxy-2-methyl[p-(1-methylvinyl)propiophenone], 2-hydroxy-2-n-butyl[p-(1-methylvinyl)-n-butyrophenone], p-vinylbenzoylcyclohexan-1-ol, p-vinylbenzoyl-2-carbomethoxycyclohexan-1-ol, 2-methoxy-2-methyl(p-vinylpropiophenone), (1-methoxycyclohexyl)-p-(1-methylvinyl)-phenylketone, p-vinylbenzoyl-2-carbomethoxycyclohexen-4-ol, 2-trimethylsilyloxy-2-methyl[p-(1-methylvinyl)-propiophenone], 2-hydroxy-2-methyl[(p-carbomethoxyvinylpropiophenone)], 2,3-di[4-(2-hydroxyisobutyryl)phenyl]-4-methylpentene (in either isomer form as 2,4-di[4-(2-hydroxyisobutyryl)phenyl]-1-methyl-pent-1-ene or 2,4-di[4-(2-hydroxyisobutyryl)phenyl]-1-methyl-pent-2-ene), and their oligo and polymerisation products, such as: poly[2-hydroxy-2-methyl-(p-vinylpropiophenone)], poly[2-hydroxy-2-methyl(p-(1-methylvinyl)propiophenone)], poly[p(1-methylvinyl)benzoylcyclohexanol] and poly[2-trimethylsilyloxy-2-methyl(p-(1-methylvinyl)propiophenone)], with a degree of polymerisation n of between 2 and 50.

Non-limiting examples of the polymer chain initiation and termination groups A and B are:

| | |
|---|---|
| Hydrogen | H |
| Benzyl | C$_6$H$_5$CH$_2$— |
| Benzoyl | C$_6$H$_5$CO— |
| Benzoyloxy | C$_6$H$_5$COO— |
| t-butyl | (CH$_3$)$_3$—C— |
| t-butoxy | (CH$_3$)$_3$CO— |
| 2-isobutyronitrile |  |

The compounds according to the present invention can be advantageously used in various photochemically crosslinkable systems based on unsaturated monomers and prepolymers.

The preferred monomers are the mono, di, tri and polyfunctional acrylic or methacrylic monomers of ester type sych as methylmethacrylate, hexanediol, diacrylate, trimethylolpropane triacrylate, pentaerythritol tetracrylate, or of acrylamide or acrylonitrile type. Other monomers include vinyl esters, vinyl ethers, variously substituted styrene, and allyl ethers.

The unsaturated polymers and prepolymers include resins based on unsaturated polyesters (fumaric and maleic), acrylated polyesters, acrylated epoxides, acrylated urethanes, acrylated polyethers etc.

The systems which can be photopolymerised by using the compounds of formulas (I) and (II) can also contain other components according to specific requirements, such as:

polymerisation inhibitors such as hydroquinone, hydroquinone monomethylether etc., thermal stabilisers to ensure darkness stability, such as phosphites, phosphines, quaternary ammonium salts, hydroxylamine derivatives, metal salts containing iron, copper etc., ultraviolet light stabilisers to further prevent premature yellowing of the manufactured products obtained, such as sterically hindered amines, 2-hydroxybenzophenones, 2-hydroxybenzotriazoles, oxalanilides, complex salts of nickel II, antioxidants such as sterically hindered phenols, inhibitors against the retarding action of oxygen in the photochemical reaction, such as 1,3-diphenylisobenzofuran, paraffin, trimethylolpropane diallylether, fillers, dyes, pigments, matting agents, auxiliaries for modifying the viscosity and surface properties such as dispersants etc., photosensitisers in the form of organic dyes which absorb in the visible portion of the electromagnetic spectrum, chain transfer agents such as alkanolamines, alcohols, thiols, hydrocarbons.

Traditional photoinitiators can be used together with the compounds of formulas (I) and (II), these being either of the fragmentation type such as benzoin ethers, benzyldimethylketal, acylphosphineoxides, or 2,2-dialkyl-2-hydroxyacetophenones, or of the hydrogen transfer type such as benzophenone, thioxanthones, quinones etc. in combination with synergist tertiary amines.

The co-use of products of formulas (I) and (II) with synergists of the alkanolamine, p-dimethylamino-benzaldehyde, ethyl p-dimethylaminobenzoate or dimethylaminoethylbenzoate type is sometimes convenient in order to accelerate the photochemical crosslinking process.

The final use of these mixtures can be as wood paints, paper lacquers, printing inks, lacquers and inks for tinplate lithography, printing plates, for engraving printed and integrated circuits, silk-screens for ceramic and textile printing, the preparation of transfer printing, polymer and resin emulsions and solutions for fabric printing etc.

The products of formulas (I) and (II) are preferably used in systems constituted by monomers, prepolymers and/or polymers comprising acrylic unsaturated bonds. They are incorporated into the system by simply dissolving in a quantity variable between 0.1% and 10% by weight, and preferably between 0.5 and 5% by weight. The photochemical crosslinking can be effected by irradiation with mercury vapour lamps having emission spectra distributed between 250 and 550 nm. The advantages of using the products of formulas (I) and (II) according to the present invention as photoinitiators are their high efficiency both with regard to the useful concentrato be used and with regard to the rate of photopolymerisation. In particular, when the compounds of formulas (I) and (II) are oligomers or polymers, they possess low vapour pressure and low volatility even in a current of steam, and this makes them particularly suitable for photochemically crosslinkable systems in an aqueous emulsion which have to be filmed by evaporation before being able to be crosslinked. When the compounds of formulas (I) and (II) are of monomer nature, during the course of the photochemical reaction and subsequent polymerisation they are able to copolymerise with the monomers and prepolymers present in the system and remain an integral part of the macromolecular products obtained. Both that portion of the photoinitiator which has not undergone photochemical reaction and the photolysis by-products, which are mainly of polymeric nature, possess high compatibility with the various systems, have low residual odour in the manufactured products and have a smaller possibility of migration, and therefore give rise to a higher grade of manufactured product. The process for preparing the aromatic-aliphatic ketones defined by the general formulas (I) and (II) according to the invention comprises the use, as the starting substance, of an aromatic substrate having at least one polymerisable substituent, and is characterized in that the final required product is obtained by various combinations of the following reactions: polymerisation of said substrate—alkylation—alphachlorination of the ketone obtained—nucleophilic substitution with the formation of epoxyether—hydrolysis of the epoxyether—enolisation—epoxidation—etherification—Grignard reaction—umpolung of aromatic aldehyde on aliphatic ketone—Bouveault/Locquin condensation—Wittig synthesis—hydroxylation.

The aromatic substrate to be used as the starting substance is preferably a monomer of sytrene or substituted styrene type, and of these the preferred compounds are styrene and alphamethylstyrene, or alternatively is an oligomer or polymer of styrene type.

Preferred embodiments of this process are illustrated by the following detailed description which is given by way of non-limiting example only.

If the final product is of polymer type, the reactions for obtaining intermediates can be conducted on the monomer, and the polymerisation carried out at a certain stage.

On the other hand, it is also possible to firstly effect the oligo or polymerisation of the suitable monomer, and then conduct the series of reactions for obtaining the final required product.

The description of the process for producing compounds according to the present invention refers, for descriptive simplicity, to those products of formula (II), indicated for brevity by

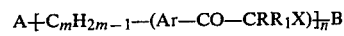

where m varies from 2 to 12 carbon atoms.

The process takes place in accordance with the following stages: Stage (A): Polymerisation

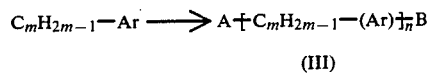

(III)

Actual polymerisation can be carried out for example using Lewis or Bronsted acids or radical initiators or anionic polymerisation initiators. For the purposes of the invention it is preferable to obtain fairly low molecular weights by effecting an oligomerisation or a telomerisation. The radical initiators which can be used include hydroperoxides, dialkylperoxides, diacylperoxides, of which di-t-butylperoxide and benzoylperoxide are preferred, or azobisisobutyronitrile.

The telogenic agents which can be used include alkyl halides such as carbon tetrachloride, alipatic and aromatic hydrocarbons, preferably toluene, or sulphuryl chloride or p-benzoquinone.

The reaction is conducted by dissolving the monomer in a solvent which is also preferably the telogenic agent, such as toluene, carbon tetrachloride or 1,2-dichloroethane, then adding the initiator in a quantity proportional to the required molecular weight, and adjusting the system to the chosen temperature. The product is then isolated by evaporating the solvent, and purified by crystallisation or repeated fractional precipitation.

Stage (B): Friedel-Crafts acylation with a carboxylic acid chloride

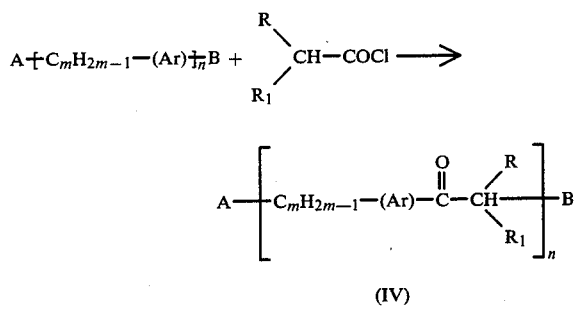

(IV)

The aromatic substrate (III) is dissolved in a solvent such as carbon disulphide, methylene chloride or dichloroethane, and reacted with a solution of the AlCl$_3$-acid chloride complex in the same solvent, preferably at a temperature of between $-20°$ and $+20°$ C.

The acylation operation can also be conducted in the presence of an aromatic solvent such as benzene, toluene or xylene.

The aromatic-aliphatic ketone (IV) is isolated by hydrolysing with water, washing and evaporating the solvent. Purification can be effected by distillation, fractional precipitation or chromatography in a silica gel column. The catalyst used can be $BF_3$, $SnCl_4$, $TiCl_4$ or other Lewis acids instead of $AlCl_3$.

Stage (C): Alphachlorination of the ketone

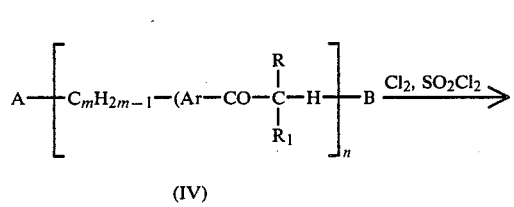

(IV)

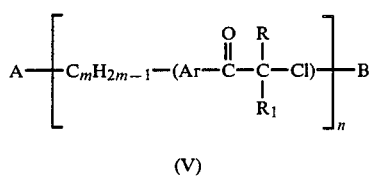

(V)

The ketone (IV) is treated with the chlorinating agent, which can be chlorine (for example in the presence of DMF), or sulphuryl chloride in the absence or in the presence of a solvent, which can be an aromatic hydrocarbon or a chlorinated aliphatic solvent. The reaction temperature is generally between 0° and 100° C.

After removing the volatile reaction by-products, the chloroketone obtained (V) does not generally require further purification before its subsequent transformation.

Stage (D): Nucleophilic substitution to obtain epoxyethers

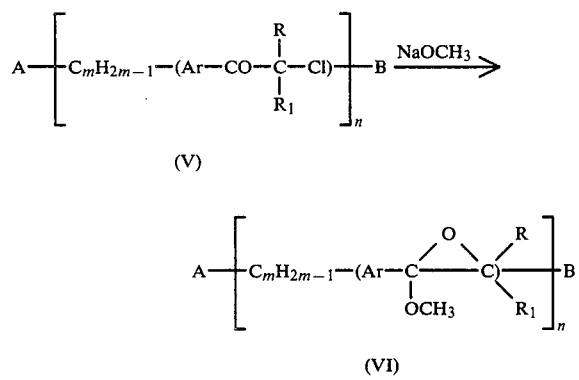

The alphachloroketone (V) is dissolved in a solvent, generally comprising a percentage of methanol, and treated with a solution or suspension of sodium methylate in slight molar excess. After some hours of reaction at a temperature of between 20° and 60° C., the sodium chloride is removed by filtration or extraction, and the epoxyether (VI), the reaction product, can be isolated for characterisation or can be subsequently transformed directly in the same solution.

Stage (E): Hydrolysis of epoxyethers

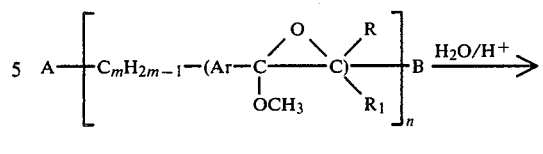

(VI)

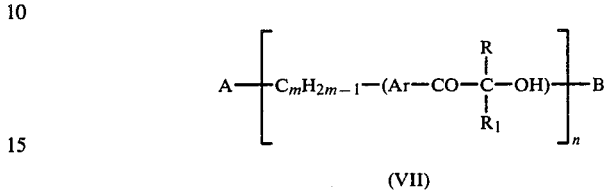

(VII)

The epoxyether solution (VI) is treated with water and acidified with mineral acid at a temperature of 10°–40° C.

When the reaction is complete, the reaction mixture is washed with water, neutralised and dried, and after evaporating the solvent, the final product (VII) is purified by the usual methods (crystallisation, repeated precipitation, chromatography over silica etc.).

The described process for obtaining the final product (VII), namely aromatic-aliphatic poly-2-hydroxyketone, allows various modifications and also alternative methods without leaving the scope of the present invention.

Some of the more significant of these modifications and alternative methods are described hereinafter.

Acylation of (III) by means of an alphachloroacid chloride to directly produce (V)

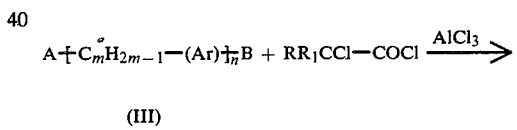

(III)

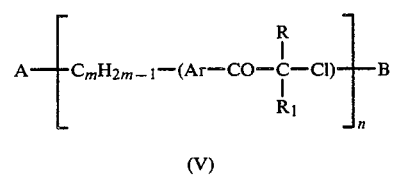

(V)

The reaction is conducted exactly as for the preceding acylation method (stage B), and the parameters which regulate its progress are analogous.

Hydrolysis of the alphachloroketone (V) to directly obtain (VII)

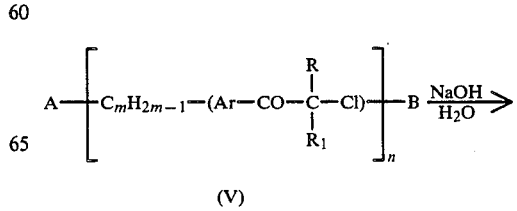

(V)

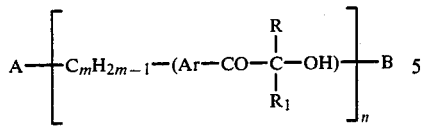

(VII)

The chloroketone dissolved in an aqueous alcoholic solvent is treated with a stoichiometric quantity of sodium hydroxide or sodium carbonate or bicarbonate. After reaction at the chosen temperature (between 20° and 90° C.) the product is isolated by the epoxyether hydrolysis method (stage E).

Epoxidation of an enolic derivative of the ketone

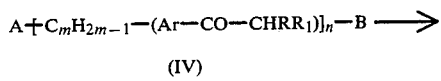

(IV)

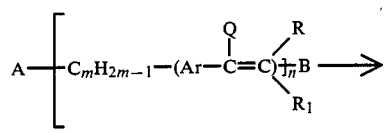

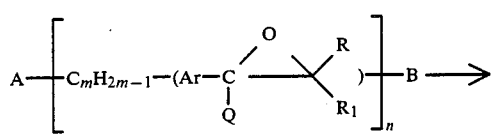

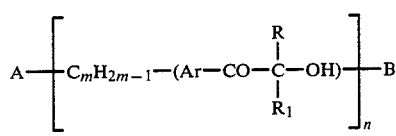

(VII)

where Q=CN or OSi(CH$_3$)$_3$.

The ketone (IV) is transformed into the trimethylsilylenolether (by treatment with hexamethyldisilazane) or into the corresponding unsaturated nitrile (by treatment with HCN).

The unsaturated compound obtained, dissolved in a chlorinated aliphatic solvent, is epoxidated (for example by means of m-chloroperbenzoic acid or permanganate) and the intermediate obtained is hydrolysed to produce (VII), as in the two preceding methods.

Grignard method

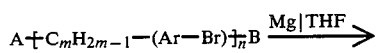

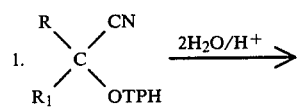

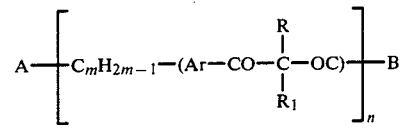

(VII)

where THP is 2-tetrahydropyranyl.

The aromatic halide is reacted with magnesium in an ether solvent or tetrahydrofuran in the normal manner for obtaining the Grignard compound, which is then reacted with the cyanhydrin (protected as tetrahydropyranylether) of the appropriate ketone. Successive hydrolysis gives the required hydroxyketone (VII)

Umpolung method an aldehyde derivatives

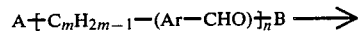

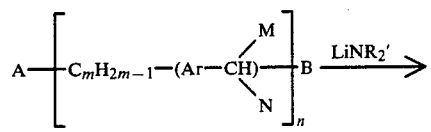

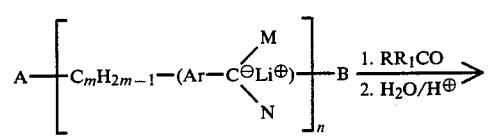

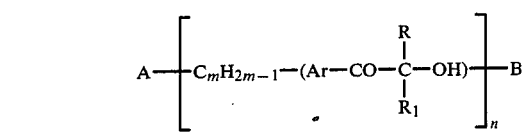

(VII)

where
M=OSi(CH$_3$)$_3$ or CN
N=N(CH(CH$_3$)$_2$)$_2$, CN or P(O)(OC$_2$H$_5$)$_2$
R'=CH(CH$_3$)$_2$ or Si(CH$_3$)$_3$.

The aromatic aldehyde is treated with trimethylchlorosilane and sodium cyanide (or trimethylsilylcyanide) or triethylphosphite or lithium diisopropylamide to give the intermediate compound, which can be transformed into the lithium salt by means of lithium diisopropylamide or lithium bistrimethylsilylamide. Subsequent reaction with the appropriate ketone, followed by hydrolysis with water in an acid environment gives the hydroxyketone (VII).

The reaction temperature is generally between −60° and 20° C., and the solvent is of the ether type such as tetrahydrofuran.

Bouveault-Locquin condensation method

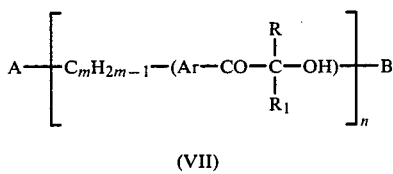

(VII)

The ester and ketone are dissolved in a solvent which can be of aromatic or aliphatic type (it can be the same ketone) and treated under cold conditions (−20° to +20° C.) with metal sodium. On termination of the reaction, it is neutralised with acetic acid and the hydroxyketone (VII) is isolated in the normal manner.

The yield is generally low and the product of low purity.

Wittig method

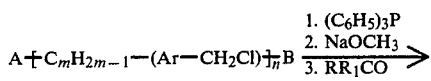

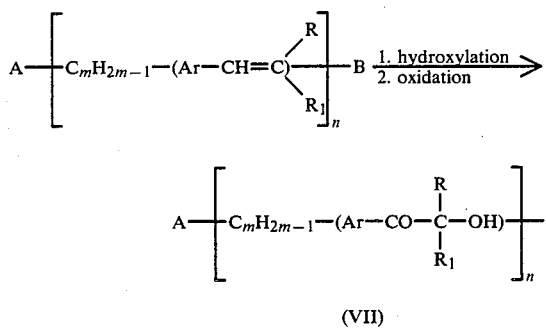

(VII)

The first part of the reaction is normally conducted in aromatic solvents using sodium methylate or potassium hydroxide as bases. In the second stage the hydroxylation can be effected by means of potassium permanganate or by epoxidation (using hydrogen peroxide or organic peracids), followed by hydrolysis by water in an acid environment.

The oxidation can be effected for example by means of aluminium isopropylate in acetone, by means of chromic anhydride reagents, or by means of aqueous sodium hypochlorite and phase transfer catalysts.

Finally, whatever the method used for producing the hydroxyketone (VII), this latter can be etherified by the following reaction:

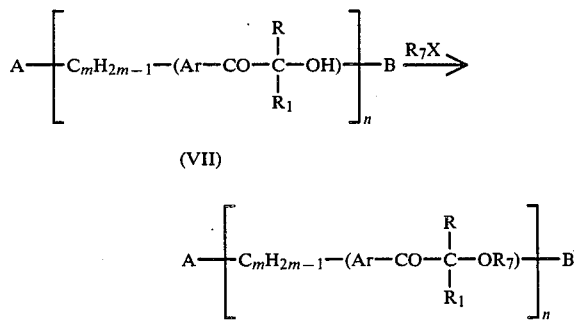

where $R_7$ is $CH_3$ or $Si(CH_3)_3$.

The hydroxyketone (VII), dissolved in a suitable solvent, is treated with the etherifying agent which can for example be methyl chloride, methyl iodide, dimethyl sulphate or trimethyl chlorosilane, and a base for capturing the acid residue. The product is isolated in the normal manner.

The following examples are given as non-limiting illustration of the production process and application of the products according to the present invention.

EXAMPLE 1

Preparation of poly 2-hydroxy-2-methyl(4-vinylpropiophenone)

The preparation is effected by the five stages described hereinafter.

Stage (A): polystyrene preparation

A solution prepared from 142.7 g of styrene, 64.5 ml of toluene and 56.7 g of 75% benzoyl peroxide containing water is slowly dripped onto 75 ml of toluene kept at 95° C.–102° C. After 4 hours of heating to 100° C., the solvent is evaporated to obtain 210 g of a styrene oligomer containing about 4 monomer units, a benzoyloxy residue and a benzyl residue as chain initiation and termination respectively.

The product is a very viscous liquid which becomes fluid at 50° C. and has an infrared spectrum with characteristic bands at 1720 (C=O), 1600, 1490, 1450, 1270, 750 and 700 cm$^{-1}$.

Stage (B): preparation of poly(4-vinylisobutyrophenone)

A solution prepared from 122.8 g of isobutyryl chloride, 236 ml of methylene chloride and 153.6 g of anhydrous aluminium trichloride is dripped slowly into a solution formed from 119 g of polystyrene prepared in stage (A) and 190 ml of methylene chloride, controlling the temperature at between −3° C. and 0° C. The reaction mixture is then kept for 2 hours at 5° C. and is then hydrolysed with water and ice. The organic phase is washed with 37% HCl, then with water, and neutralised to pH 8.

The solvent is removed by evaporation to obtain 148 g of a very viscous product (which becomes fluid at 60° C.) having an infrared spectrum with characteristic bands at 1720, 1680 (C=O), 1600, 1470, 1450, 1230, 980, 850 and 700 cm$^{-1}$.

Stage (C): preparation of poly 1-(4-vinylphenyl)-2-chloro-2-methylpropanone 149.3 g of sulphuryl chloride are slowly added at 40°–45° C. to a solution of 148 g of the product prepared in stage (B) in 200 ml of toluene.

After 2 hours at 45° C., the mixture is washed with water, neutralised and the solvent evaporated under vacuum to obtain 170 g of a very viscous oil having an infrared spectrum with characteristic bands at 2930, 1720, 1680, 1600, 1270, 1165, 1115, 980 and 700 cm$^{-1}$.

Stage (D): preparation of poly 1-(4-vinylphenyl)-1-methoxy-2,2-dimethyloxirane 36 g of sodium methylate are slowly added to a solution of 113 g of the product obtained in stage (C) in 166 ml of toluene and 89 ml of methanol, maintaining the temperature below 45° C.

After 2 hours at 45° C., the solution is clarified by filtration, and the solvent is evaporated to obtain 110 g of a very viscous liquid having an infrared spectrum with characteristic bands at 2930, 1460, 1270, 1235, 1130, 1110, 830 and 700 cm$^{-1}$.

Stage (E): preparation of poly 2-hydroxy-2-methyl(4-vinylpropiophenone)

110 g of the product obtained in stage (D) are dissolved in 100 ml of methanol and 100 ml of toluene and treated with 170 ml of water and slowly with 100 ml of 37% hydrochloric acid maintaining the temperature below 35° C. After 2 hours of agitation, the organic phase is washed with water and neutralised, and the solvent removed by evaporation under vacuum to obtain 100 g of a very viscous liquid with a pour point of about 50° C., and having an infrared spectrum with characteristic bands at 3450, 2980, 2920, 1670, 1600, 1450, 1360, 1260, 1160, 960, 750 and 700 cm$^{-1}$.

EXAMPLE 2

Preparation of poly 2-hydroxy-2-methyl-p(1-methylvinyl) propiophenone

The preparation is effected in five stages as described hereinafter.

Stage (A'): preparation of poly alphamethylsytrene A solution prepared from 67.9 g of alphamethylstyrene, 27.5 ml of toluene and 23.85 g of 75% benzoyl peroxide is slowly dripped onto 40 ml of toluene maintained at about 100° C.

After 3 hours of heating to 100° C., the solvent is evaporated to obtain 85 g of an alphamethylstyrene oligomer containing about 4 monomer units, a benzoyloxy residue and a benzyl residue as chain initiation and termination respectively.

The product is a viscous but fluid liquid even at ambient temperature and has an infrared spectrum with characteristic bands at 1720 (C=O), 1600, 1450, 1270, 1110, 760 and 700 cm$^{-1}$.

Stage (B'): preparation of poly[4-(1-methylvinyl)isobutyrophenone]

A solution prepared from 67 g of isobutyryl chloride, 125 ml of methylene chloride and 83.7 g of anhydrous aluminium trichloride is slowly dripped into a solution of 73.5 g of poly alphamethylstyrene in 115 ml of methylene chloride, the temperature being controlled at 0° C. After 2 hours at 5° C., the mixture is hydrolysed with water and ice and the organic phase washed with 37% HCl, then with water, and finally neutralised to pH 8 to obtain after evaporating the solvent 115 g of ketone polymer in the form of a viscous oil having an infrared spectrum with characteristic bands at 2950, 1675 (C=O), 1600, 1460, 1450, 1220, 975, 840 and 700 cm$^{-1}$.

Stage (C'): preparation of poly 1-[4-(1-methylvinyl)phenyl]-2-chloro-2-methylpropanone 74.3 g of sulphuryl chloride are slowly added at 40°–45° C. to a solution of 79 g of product obtained in stage (B') in 107 ml of toluene.

After 2 hours at 45° C. the mixture is washed with water, neutralised and the solvent evaporated under vacuum to obtain 96 g of a viscous oil having an infrared spectrum with characteristic bands at 2950, 1680, 1600, 1450, 1270, 1170, 1120, 985, 840 and 700 cm$^{-1}$.

Stage (D'): preparation of poly 1-[4-(1-methylvinyl)phenyl]-1-methoxy-2,2-dimethyloxirane 30 g of sodium methylate are slowly added to a solution of 96 g of the product obtained in stage (C') in 130 ml of toluene and 70 ml of methanol, maintaining the temperature below 45° C.

After 2 hours at 45° C. the solution is clarified by filtration and the solvent evaporated to obtain 94 g of a viscous liquid having an infrared spectrum with characteristic bands at 2950, 1450, 1270, 1230, 1110, 830 and 700 cm$^{-1}$.

Stage (E'): preparation of poly 2-hydroxy-2-methyl-p-(1-methylvinyl)propiophenone 94 g of the product obtained in stage (D') are dissolved in 90 g of methanol and 90 g of toluene and treated with 140 ml of water and slowly with 82 ml of 37% hydrochloric acid maintaining the temperature below 35° C. After 2 hours of agitation, the organic phase is washed with water and neutralised, and the solvent removed by evaporation under vacuum to obtain 87 g of a viscous liquid with a pour point of about 10° C., and having an infrared spectrum with characteristic bands at 3450, 2970, 1670, 1600, 1450, 1370, 1260, 1170, 960, 830 and 700 cm$^{-1}$.

EXAMPLE 3

Preparation of poly 1-[4-(1-methylvinyl)phenyl]-2-chloro-2-methylpropanone

This preparation constitutes a possible modification of the process of Example 2.

A solution prepared from 120 g of alphamethylstyrene in 80 g of benzene is treated slowly at between −5° and 0° C. with 212 g of isobutyryl chloride and 266 g of anhydrous aluminium trichloride. After 2 hours at 0°–5° C. the solution is treated slowly with 100 g of water and then at 20° C. with 270 g of sulphuryl chloride. After a further 2 hours of reaction, the mixture is hydrolysed with water and ice, the organic phase washed with water, neutralised, and dried at 80° C. and 40 mmHg to obtain 398 g of an oily liquid containing about 55% of the polymeric product stated in the title and 45% of alphachloroisobutyrophenone.

EXAMPLE 4

Preparation of poly 2-hydroxy-2-methyl-p-(1-methyl-vinyl)propiophenone

This preparation constitutes a possible modification of the process of Example 2.

A solution of 398 g of the product obtained in Example 3 in 200 ml of methanol and 200 ml of toluene is treated slowly at 20° C. with 130 g of sodium methylate. After 4 hours at 40° C., 300 ml of water and 200 ml of 37% hydrochloric acid are introduced.

After 2 hours at 35° C. the organic phase is washed with water and neutralised, and the solvent removed by evaporation under vacuum to obtain 350 g of an oily liquid containing about 55% of polymeric product and 45% of alphahydroxyisobutyrophenone.

EXAMPLE 5

(Applicational Example)

A photochemically crosslinkable mixture consisting of 56 parts by weight of unsaturated acrylic resin (obtained from bisphenol A bisglycidylether and acrylic acid and having an acidity number of 3), 14 parts by weight of hexanediol diacrylate, 30 parts by weight of trimethylolpropane triacrylate and 0.5 parts by weight of a levelling aid (copolymer based on dimethylsiloxane, propylene oxide, ethylene oxide) and a variable quantity of photoinitiators obtained in Examples 1, 2 and 4 is applied to a glass plate to a thickness of 200 microns. After exposure to air for 30 seconds the films are irradiated by passing successively at 20 m/sec under a medium pressure mercury vapour lamp of power 40 W/cm at a distance of 10 cm. The following table shows the Sward hardness measured 10 minutes after each pass.

The storage stability of the resin-photoinitiator mixtures in darkness at 60° C. exceeds 30 days in all cases.

| Photoinitiator | SWARD HARDNESS | | | | |
|---|---|---|---|---|---|
| | Quantity % by weight | Number of passes | | | |
| | | 1 | 2 | 3 | 4 |
| Reference | 0.5 | 0 | 2 | 4 | 8 |
| substance (1) | 1.5 | 2 | 18 | 35 | 36 |
| | 2.5 | 15 | 38 | 40 | 38 |
| Product of | 0.5 | 0 | 2 | 4 | 10 |
| Example 1 | 1.0 | 2 | 10 | 26 | 32 |
| | 1.5 | 3 | 18 | 36 | 35 |
| | 2.0 | 5 | 34 | 38 | 40 |
| | 2.5 | 14 | 38 | 40 | 36 |
| Product of | 0.5 | 0 | 5 | 20 | 28 |
| Example 2 | 1.0 | 2 | 8 | 26 | 44 |
| | 1.5 | 4 | 24 | 40 | 40 |
| | 2.0 | 8 | 33 | 41 | 40 |
| | 2.5 | 15 | 38 | 40 | 38 |
| Product of | 0.5 | 0 | 3 | 5 | 16 |
| Example 4 | 1.0 | 2 | 9 | 25 | 32 |
| | 1.5 | 3 | 17 | 35 | 38 |
| | 2.0 | 5 | 30 | 39 | 39 |
| | 2.5 | 14 | 38 | 40 | 36 |

(1) 1-(4-isopropylphenyl)-2-hydroxy-2-methylpropanone (U.S. Pat. No. 4,347,111)

In this and in the subsequent examples, the Sward hardness was determined by the ASTM D-2134-66 method.

EXAMPLE 6

(Applicational example)

A photochemically crosslinkable mixture constituted by 65 parts by weight of a vinylester acrylate (acid number 9.6, unsaturation equivalent 245), 35 parts by weight of hexanediol diacrylate and 0.5 parts by weight of a levelling aid (copolymer based on dimethyl siloxane, propylene oxide, ethylene oxide) and a variable quantity of photoinitiators obtained in Examples 1 and 2 is applied to a glass plate to a thickness of 200 microns. After exposure to air for 30 seconds the films are irradiated under the conditions described in Example 5. The following table shows the Sward hardness measured 10 minutes after each pass.

The storage stability of the resin-photoinitiator mixture in darkness at 60° C. exceeds 30 days in all cases.

| Photoinitiator | SWARD HARDNESS | | | | |
|---|---|---|---|---|---|
| | Quantity % by weight | Number of passes | | | |
| | | 1 | 2 | 3 | 4 |
| Reference | 0.5 | 0 | 2 | 2 | 5 |
| substance (1) | 1.5 | 2 | 6 | 8 | 13 |
| | 2.5 | 2 | 8 | 16 | 20 |
| Product of | 0.5 | 0 | 2 | 2 | 5 |
| Example 1 | 1.0 | 0 | 2 | 4 | 8 |
| | 1.5 | 2 | 5 | 8 | 14 |
| | 2.0 | 2 | 8 | 13 | 22 |
| | 2.5 | 2 | 8 | 16 | 21 |
| Product of | 0.5 | 2 | 2 | 4 | 8 |
| Example 2 | 1.0 | 2 | 4 | 8 | 15 |
| | 1.5 | 2 | 6 | 10 | 17 |
| | 2.0 | 2 | 8 | 17 | 24 |
| | 2.5 | 2 | 9 | 18 | 25 |

(1) 1-(4-isopropylphenyl)-2-hydroxy-2-methylpropanone

EXAMPLE 7

(Applicational example)

The films crosslinked under the conditions described in Example 6 are artificially aged by prolonged exposure to a mercury vapour lamp, the radiation of which causes yellowing and degradation. The yellowing indices are measured at regular intervals and are given in the following table.

| Photoinitiator | YELLOWING INDEX (YI) | | | | |
|---|---|---|---|---|---|
| 2.5% by weight | hours of exposure | | | | |
| | 0 | 50 | 100 | 200 | 300 |
| Reference substance | 10 | 11 | 13 | 15 | 16 |
| Example 1 | 7 | 8 | 13 | 14.5 | 15 |
| Example 2 | 10 | 11.5 | 13 | 14.5 | 16 |

The yellowing index was determined by the ASTM D-1925 method.

EXAMPLE 8

(Applicational example)

Variable quantities of photoinitiator and 0.5% by weight of a levelling agent (silicone-ethylene oxide copolymer) are added to a 50 weight % aqueous emulsion of a photochemically crosslinkable unsaturated acrylic resin (modified polyester).

The mixtures obtained are applied to glass plates to a thickness of 200 microns. The films are dried in an oven at 80° C. for 30 minutes. After cooling for 15 minutes in darkness, the films are irradiated by passing once at 10 m/min under a medium pressure mercury vapour lamp of 80 W/cm at 10 cm distance.

The following table shows the Sward hardness measured 10 minutes after irradiation.

| Photoinitiator | SWARD HARDNESS | | |
|---|---|---|---|
| | Quantity % by weight | | |
| | 1 | 2 | 3 |
| Reference substance (1) | 16 | 14 | 12 |
| Reference substance (2) | 12 | 16 | 4 |
| Example 1 | 16 | 19 | 20 |
| Example 2 | 16 | 22 | 20 |

(1) 1-(4-dodecylphenyl)-2-hydroxy-2-methylpropanone
(2) 1-(4-isopropylphenyl)-2-hydroxy-2-methylpropanone
(1) and (2) are products in accordance with U.S. Pat. No. 4,347,111.

EXAMPLE 9

(Applicational example)

3.8 parts by weight of photoinitiator obtained in Example 1 are dissolved in a mixture of 128 parts by weight of n-butylacrylate and 210 parts by weight of hexanediol diacrylate. The mixture, applied to a thickness of 10 microns between two sheets of NaCl, is irradiated by a medium pressure mercury vapour lamp (Helios Italquartz Mod. GN 500 L) of 500 Watts at a distance of 20 cm for known times.

The residual quantity of double bond is measured at regular intervals by infrared analysis on the characteristic bands.

The following table shows the kinetics by which the double bond disappears, by indicating the percentage quantity of double bond present at each determination with respect to zero time.

| PERCENTAGE QUANTITY OF DOUBLE BOND | | | | | | |
|---|---|---|---|---|---|---|
| | Time (seconds) | | | | | |
| Photoinitiator | 0 | 0.5 | 1 | 1.5 | 2 | 2.5 |
| Reference substance (1) | 100 | 95 | 85 | 60 | 27 | 14 |
| Example 1 | 100 | 80 | 40 | 15 | 12 | 9 |

(1) 1-phenyl-2-hydroxy-2-methylpropanone

EXAMPLE 10

(Applicational example)

A resin formulated as in Example 5 and containing 3% by weight of photoinitiator is applied to glass plates to a thickness of 50 microns. After exposure to air for 30 seconds, ageing is effected by passing once at variable speed under a medium pressure mercury vapour lamp of 50 watts/cm at 10 cm distance. The Sward hardness is determined after 10 minutes and is given in the following table.

| SWARD HARDNESS | | | |
|---|---|---|---|
| | Passage speed (m/min) | | |
| Photoinitiator | 4 | 11 | 17 |
| Reference substance (1) | 44 | 36 | 30 |
| Example 1 | 44 | 37 | 32 |
| Example 2 | 44 | 35 | 29 |

(1) 1-(4-isopropylphenyl)-2-hydroxy-2-methylpropanone

EXAMPLE 11

(Applicational example)

A resin formulated as in Example 6 containing 3% by weight of photoinitiator is applied to glass plates to a thickness of 25 microns. After exposure to air for 30 seconds the films are irradiated with an 80 watt/cm lamp at a distance of 10 cm, at the maximum speed at which the film obtained could no longer be detected on touching.

The maximum conveying speed was found to be 20 m/min both for the photoinitiators of Examples 1 and 2 and for the reference substance [1-(4-isopropylphenyl)-2-hydroxy-2-methylpropanone].

We claim:

1. In a method for the photopolymerization of ethylenically unsaturated compounds the improvement comprising using as a photoinitiator an aromatic-aliphatic ketone of the formula (II)

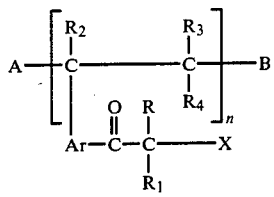

where:
n varies from 2 to 50;
Ar represents phenylene;
X represents OH, $O.Si(CH_3)_3$ or $OCH_3$;
R, $R_1$, which can be equal or different, each independently represent an alkyl of 1 to 4 carbon atoms, or together represent an alkylene of 2 to 5 carbon atoms;
$R_2$, $R_3$, $R_4$, each independently represent hydrogen or linear or branched alkyl unsubstituted or substituted with $-C_6H_4-CO-C(RR_1)X$;
A and B each independently representing H, alkyl, alkoxy, aralkyl, acyl, aroyl, aroyloxy, or 2-isobutyrylnitrile.

2. A method for the photopolymerization of ethylenically unsaturated compounds in accordance with claim 1, wherein the photoinitiator is the oligo or polymerization product of one compound selected from the group consisting of 2-hydroxy-2-methyl-p-(1-methylvinyl)-propiophenone, 2,4-di[4-(2-hydroxyisobutyryl)phenyl]-1-methyl-pent-1-ene, 2,4-di[4(2-hydroxyisobutyryl)-phenyl]-1-methyl-pent-2-ene, 2-hydroxy-2-methyl-(p-vinylpropiophenone), p(1-methylvinyl) benzoylcyclohexan-1-ol, and 2-trimethyl-siloxy-2-methyl(p-(1-methylvinyl)propiophenone.

3. A photopolymerizable system comprising ethylenically unsaturated compounds and a quantity of between 0.1% and 10% of an aromatic-aliphatic ketone photoinitiator of the formula (II)

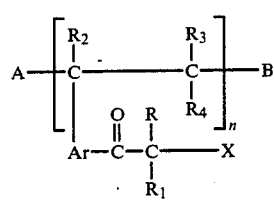

where:
n varies from 2 to 50;
Ar represents phenylene;
X represents OH, $O.Si(CH_3)_3$ or $OCH_3$;
R, $R_1$, which can be equal or different, each independently represent an alkyl of 1 to 4 carbon atoms, or together represent an alkylene of 2 to 5 carbon atoms;
$R_2$, $R_3$, $R_4$, each independently represent hydrogen or linear or branched alkyl unsubstituted or substituted with $-C_6H_4-CO-C(RR_1)X$;
A and B each independently representing H, alkyl, alkoxy, aralkyl, acyl, aroyl, aroyloxy, or 2-isobutyrylnitrile.

* * * * *